United States Patent
Yang et al.

(10) Patent No.: US 8,519,372 B2
(45) Date of Patent: Aug. 27, 2013

(54) ELECTROFORMING-FREE NANOSCALE SWITCHING DEVICE

(75) Inventors: Jianhua Yang, Palo Alto, CA (US); Shih-Yuan Wang, Palo Alto, CA (US); R. Stanley Williams, Portola Valley, CA (US); Alexandre Bratkovski, Mountain View, CA (US); Gilberto Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 97 days.

(21) Appl. No.: 13/259,173

(22) PCT Filed: Jul. 30, 2009

(86) PCT No.: PCT/US2009/052255
§ 371 (c)(1),
(2), (4) Date: Sep. 23, 2011

(87) PCT Pub. No.: WO2011/014172
PCT Pub. Date: Feb. 3, 2011

(65) Prior Publication Data
US 2012/0223286 A1 Sep. 6, 2012

(51) Int. Cl.
*H01L 29/02* (2006.01)

(52) U.S. Cl.
USPC ............ 257/2; 257/5; 257/E45.002

(58) Field of Classification Search
USPC ............ 257/2, 5, E45.002
See application file for complete search history.

(56) References Cited

U.S. PATENT DOCUMENTS
2004/0159835 A1 8/2004 Krieger et al.
2007/0117256 A1 5/2007 Stewart et al.

OTHER PUBLICATIONS
Advanced Materials, vol. 21, pp. 3754-3758, "A Family of Electronically Reconfigurable Nanodevices," by Yang et al., Jun. 2009.*
PCT International Search Report, May 3, 2010, Application No. PCT/US2009/052255, Filed Jul. 30, 2009.

* cited by examiner

*Primary Examiner* — Mark Prenty

(57) ABSTRACT

A nanoscale switching device is constructed such that an electroforming process is not needed to condition the device for normal switching operations. The switching device has an active region disposed between two electrodes. The active region has at least one switching layer formed of a switching material capable of transporting dopants under an electric field, and at least one conductive layer formed of a dopant source material containing dopants that can drift into the switching layer under an electric field. The switching layer has a thickness about 6 nm or less.

12 Claims, 5 Drawing Sheets

ELECTROFORMING-FREE NANOSCALE SWITCHING DEVICE

BACKGROUND

The continuous trend in the development of electronic devices has been to minimize the sizes of the devices. While the current generation of commercial microelectronics are based on sub-micron design rules, significant research and development efforts are directed towards exploring devices on the nanoscale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, resistive switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interests, and there are substantial on-going research efforts to further develop such nanoscale switches and to implement them in various applications.

One major issue in developing memristive nanoscale switching devices is that devices based on metal oxides as the switching material always required an "electroforming" process before they can be used for normal switching cycles. The electroforming process involves the one-time application of a relative high voltage or current to produce a significant change of the electronic conductivity of the device. Only after the forming can the device be operated as a tunable resistance switch that can go through repeated ON/OFF cycles. The electroforming process is not a very well controlled process and is potentially destructive, as the conductivity change is very sudden, and the voltage at which the change occurs varies greatly from device to device. A greater problem, however, is that the formed metal oxide switching devices show a wide variance of operational properties, such as the voltage required for switching the device ON or OFF or to a selected resistance value, and the variations appear to depend on the details of electroforming. The wide variance in operational properties makes it difficult to use the switching devices in applications such as computing circuits. The lack of device repeatability can be a major barrier for the technological implementation of the nanoscale switching devices.

BRIEF DESCRIPTION OF THE DRAWINGS

Some embodiments of the invention are described, by way of example, with respect to the following figures.

DETAILED DESCRIPTION

Figure 1:
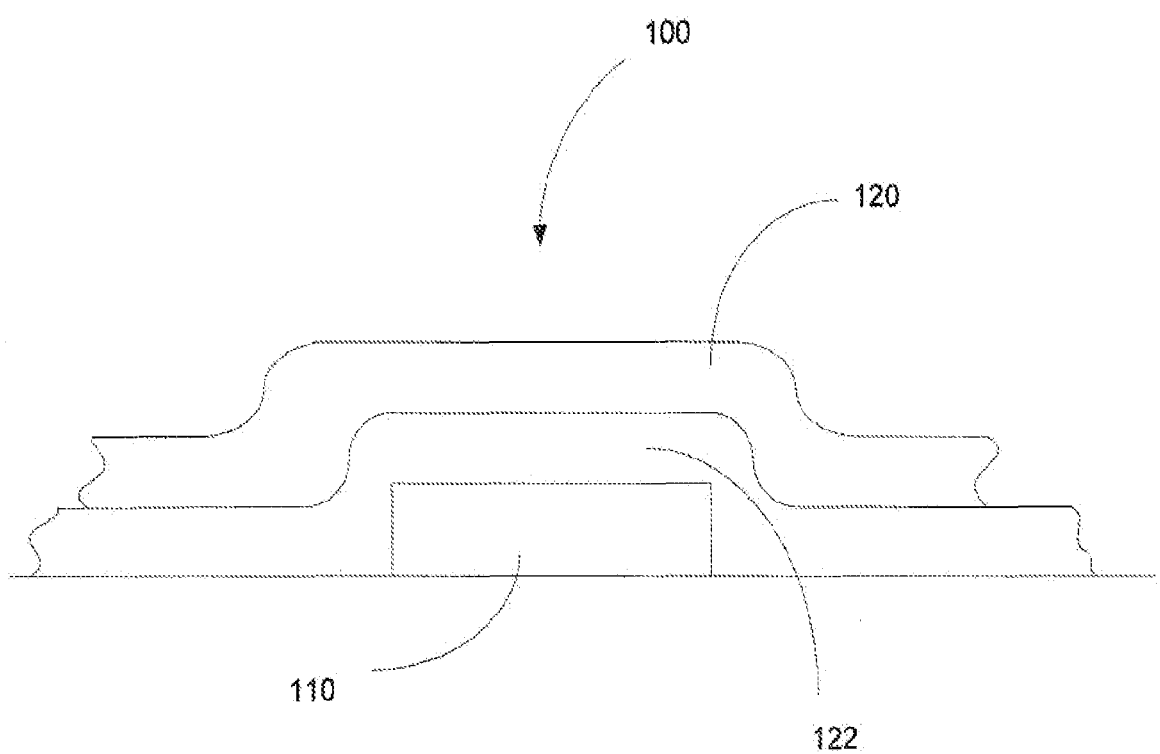
FIG. 1 is a cross-sectional view of a nanoscale switching device in accordance with an embodiment of the invention that is electroforming-free.

FIG. 1 shows an embodiment of a nanoscale switching device 100 in accordance with the invention that does not require an electroforming process to condition it for normal switching operations. In other words, the device is "electroforming-free." The switching device 100 includes a bottom electrode 110 and a top electrode 120, and an active region 122 disposed between the two electrodes. Each of the bottom and top electrodes 110 and 120 is formed of a conductive material and has a width and a thickness on the nanoscale. As used hereinafter, the term "nanoscale" means the object has one or more dimensions smaller than one micrometer. In this regard, each of the electrodes may be in the form of a nanowire. Generally, the active region 122 contains a switching material that is capable of carrying a selected species of dopants such that the dopants can drift through the switching material under a sufficiently strong electric field. The drifting of the dopants results in a redistribution of dopants in the active region, which is responsible for switching behavior of the device, as will be described in greater detail below.

The present invention is directed to the construction of the active region of a nanoscale switching device in such a way that the device does not require electroforming. As mentioned earlier, prior to the present invention, nanoscale switching devices using a metal oxide switching material appeared to always require an initial irreversible electroforming step to put the devices in a state capable of normal switching operations. The electroforming process is typically done by applying a voltage sweep to a relatively high voltage, such as from 0V up to −20V for negative forming or 0V to +10V for positive forming. The sweep range is set such that device is electroformed before reaching the maximum sweep voltage by exhibiting a sudden jump to a higher current and lower voltage in the I-V curve. The electroforming operation is difficult to control due to the suddenness of the conductivity change. Moreover, the formed devices exhibit a wide variance of operational properties depending on the details of the electroforming.

In connection with the present invention, it has been recognized by the inventors that the electroforming step may be related to an electrolytic reduction process that decomposes the metal oxide switching material. It is believed that the electrolytic reduction creates oxygen vacancies, which then drift through the switching material under the high electric field, and the drifting may be enhanced by the electrical heating caused by the electroforming voltage and current. The oxygen vacancies drift towards the cathode (the negative electrode) and, as a result, localized conducting channels due to a high concentration of oxygen vacancies are formed within the metal oxide switching material. The formation of such localized conducting channels through the bulk switching material is believed to account for the sudden and drastic reduction of the electrical conductivity of the device. It is also believed that after the electroforming process the ON/OFF switching behavior is concentrated mainly at the interface region of the switching material and one or both of the electrodes.

In accordance with an embodiment of the invention, the need for the electroforming operation that creates localized conductive channels within the switching material is effectively eliminated by employing a very thin layer of switching material. It has been observed by the inventors that when the switching material layer is around or less than 6 nm thick, the switching device does not exhibit the electroforming behavior and is able to follow the normal I-V curve of a switching cycle from the very beginning.

Figure 2:
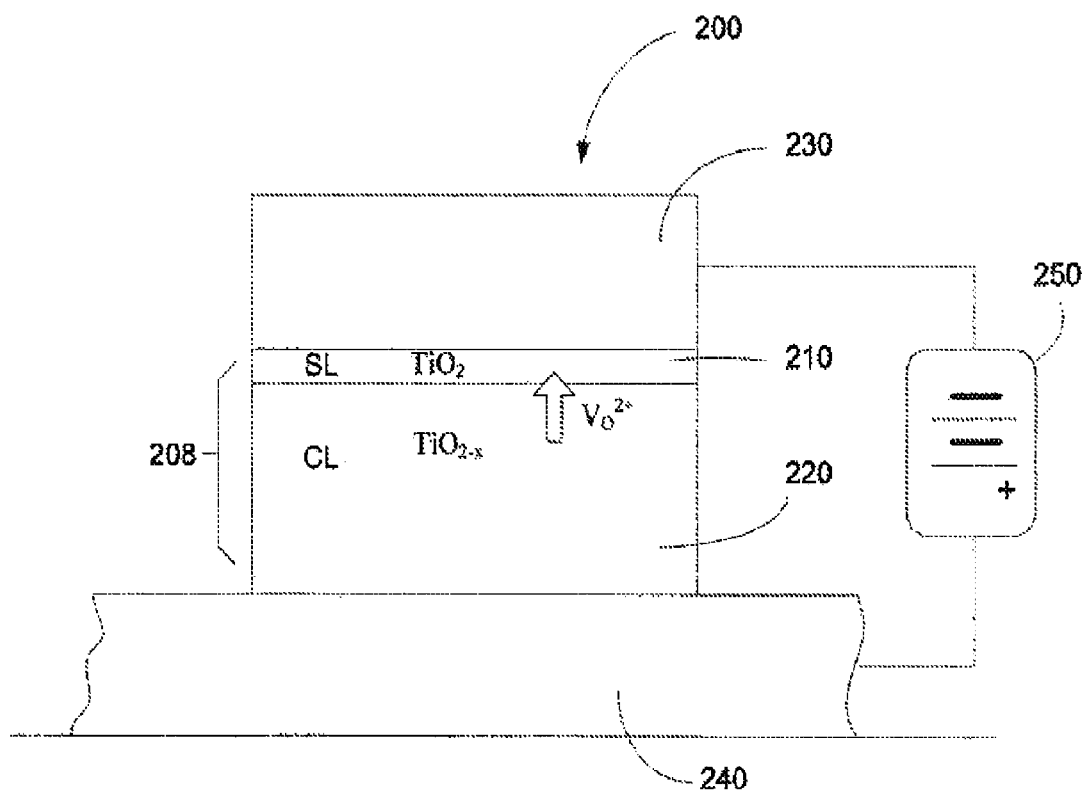
FIG. 2 is a schematic cross-sectional view of an embodiment of an electroforming-free nanoscale switching device.

FIG. 2 shows one embodiment of a switching device 200 that is electroforming-free based on the use of a thin switching material layer. As shown in FIG. 2, the active region 208 of the switching device includes a thin switching layer ("SL") 210, and comparably thick conductive layer ("CL") 220. The thickness of the switching layer in some embodiments may be about 6 nm or less, and in other embodiments about 4 nm or less. The switching layer 210 is formed of a switching material, while the conductive layer 220 is formed of a dopant source material. Generally, the switching material may be electronically semiconducting or nominally insulating and a weak ionic conductor. The dopant source material, in contrast, is a material that contains a relatively high concentration of dopants of the type that can be transported by the switching material. Due to the high dopant concentration, the conductive layer is normally conductive and may contribute minimally to the overall resistance of the device. The conductive layer 220 serves as a reservoir of dopants that can drift into the switching material in the switching layer 210 to alter its electrical characteristics. The dopant source material may be generally the same as the switching material but with a higher dopant concentration. The conductive layer 220 may be thicker than the switching layer 210, but its thickness is not critical. For example the thickness of the conductive layer may range from 2 nm to 200 nm.

By way of example, as shown in FIG. 2, the switching material may be $TiO_2$, and the dopant source material may be $TiO_{2-x}$, where x may be a number much smaller than 1. In this case, the dopants are oxygen vacancies ($V_o^{2+}$). The $TiO_{2-x}$ material in the conductive layer 220 functions as a source/sink of dopants that can be driven into or out of the $TiO_2$ material in the switching layer 210 to alter the overall resistance of the switching device 200.

The nanoscale switching device 200 can be switched between ON and OFF states by controlling the concentration and distribution of the dopants in the thin switching layer 210. When a DC switching voltage from a voltage source 250 is applied across the top and bottom electrodes 230 and 240, an electric field is created across the active region 208. This electric field, if of a sufficient strength and proper polarity, may drive the dopants from the conductive layer 220 into the switching layer 210, and cause the dopants to drift through the switching material in the switching layer 210 towards the top electrode 230, thereby turning the device into an ON state.

If the polarity of the electric field is reversed, the dopants may drift in an opposite direction across the switching layer 210 and away from the top electrode 230, thereby turning the device into an OFF state. In this way, the switching is reversible and may be repeated. Due to the relatively large electric field needed to cause dopant drifting, after the switching voltage is removed, the locations of the dopants remain stable in the switching material. Since the conductivity of the device in ON state is much larger than that in OFF state, initiating switching back into OFF state may require larger bias voltage, so the system will behave as a memristor.

The state of the switching device 200 may be read by applying a read voltage to the top and bottom electrodes 230 and 240 to sense the resistance across these two electrodes. The read voltage is typically much lower than the threshold voltage required to cause drifting of the ionic dopants between the top and bottom electrodes, so that the read operation does not alter the ON/OFF state of the switching device The switching behavior described above may be based on different mechanisms. In one mechanism, the switching behavior may be an "interface" phenomenon. Initially, with a low dopant level in the switching material, the interface of the switching material and the top electrode 230 may behave like a Schottky barrier, with an electronic barrier that is difficult for electrons to tunnel through. As a result, the device has a relatively high resistance. When a switching voltage to turn the device ON is applied, the dopants drift towards the top electrodes 230. The increased concentration of dopants in the electrode interface region changes its electrical property from one like a Schottky barrier to one like an Ohmic contact, with a significantly reduced electronic barrier height or width. As a result, electrons can tunnel through the interface much more easily, and this may account for the significantly reduced overall resistance of the switching device.

In another mechanism, the reduction of resistance may be a "bulk" property of the switching material in the switching layer. An increase of the dopant level in the switching material causes the resistance across the switching material to fall, and this may account for the decrease of the overall resistance of the device between the top and bottom electrodes. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

The electroforming issue addressed by the present invention has mainly been observed in switching devices using metal oxides, such as $TiO_2$, as the switching material. Nevertheless, the structural configurations of the active region of the switching device in accordance with embodiments of the invention can also be applied to switching devices that use other types of switching materials. In this regard, many different materials with their respective suitable dopants can be used as the switching material. Besides metal oxides, materials that exhibit suitable properties for switching include, for example, sulfides, carbides, selenides, nitrides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

Figure 3:
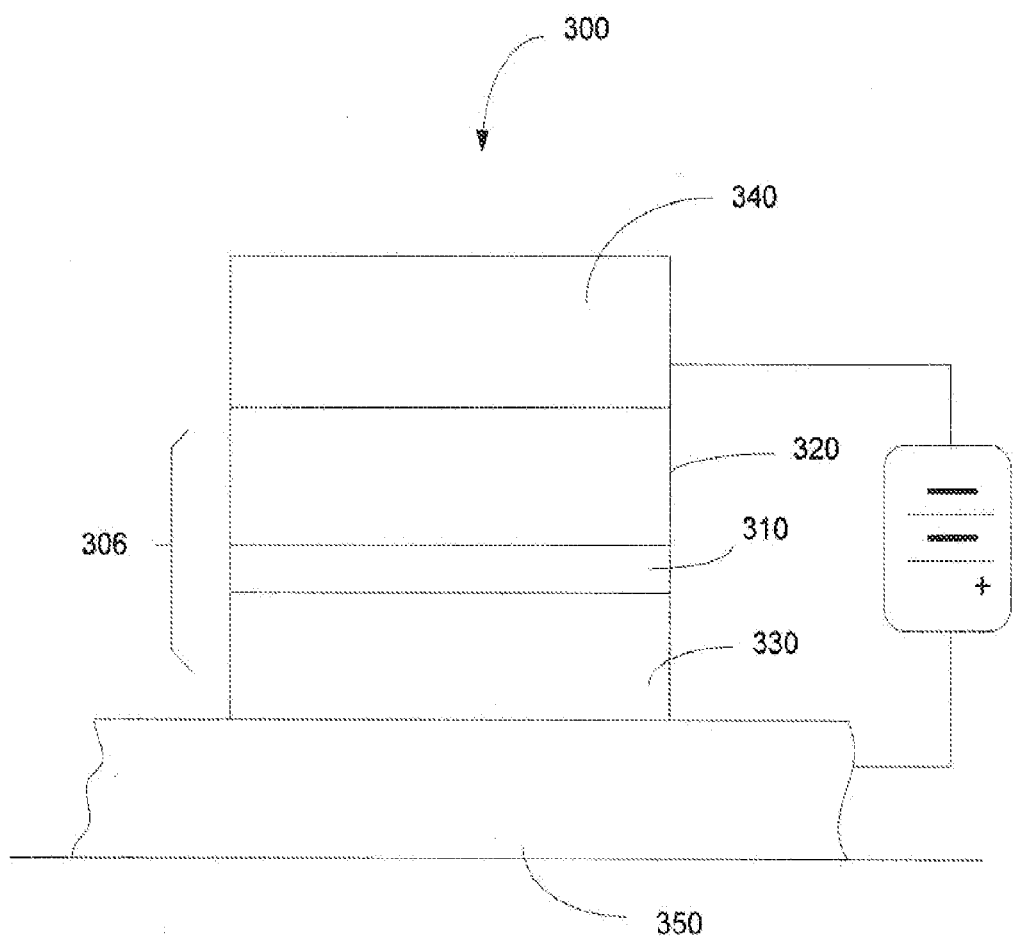
FIG. 3 is a schematic cross-sectional view of another embodiment of an electroforming-free nanoscale switching device.

FIG. 3 shows another embodiment of an electroforming-free nanoscale switching device 300. In this embodiment, the active region 306 of the switching device 300 has a thin switching layer 310 and two conductive layers 320 and 330. The switching layer 310 contains a switching material, and each of the two conductive layers 320 and 330 contains a dopant source material. The switching layer in some embodiments may have a thickness of 6 nm or less, and in other embodiments 4 nm or less. In this configuration, the switching layer 310 is sandwiched between the two conductive layers 320 and 330 and is not in direct contact with either of the electrodes 340 and 350. When a switching voltage is applied to the electrodes 340 and 350, depending on the polarity of the voltage, the dopants from the dopant source material in one of the conductive layers 320 and 330 may drift into and through the switching layer 310 to modify its electrical conductivity, thereby turning the switch ON or OFF, or turning it to a preselected resistance if the device is operated in an analogue mode.

Figure 4:
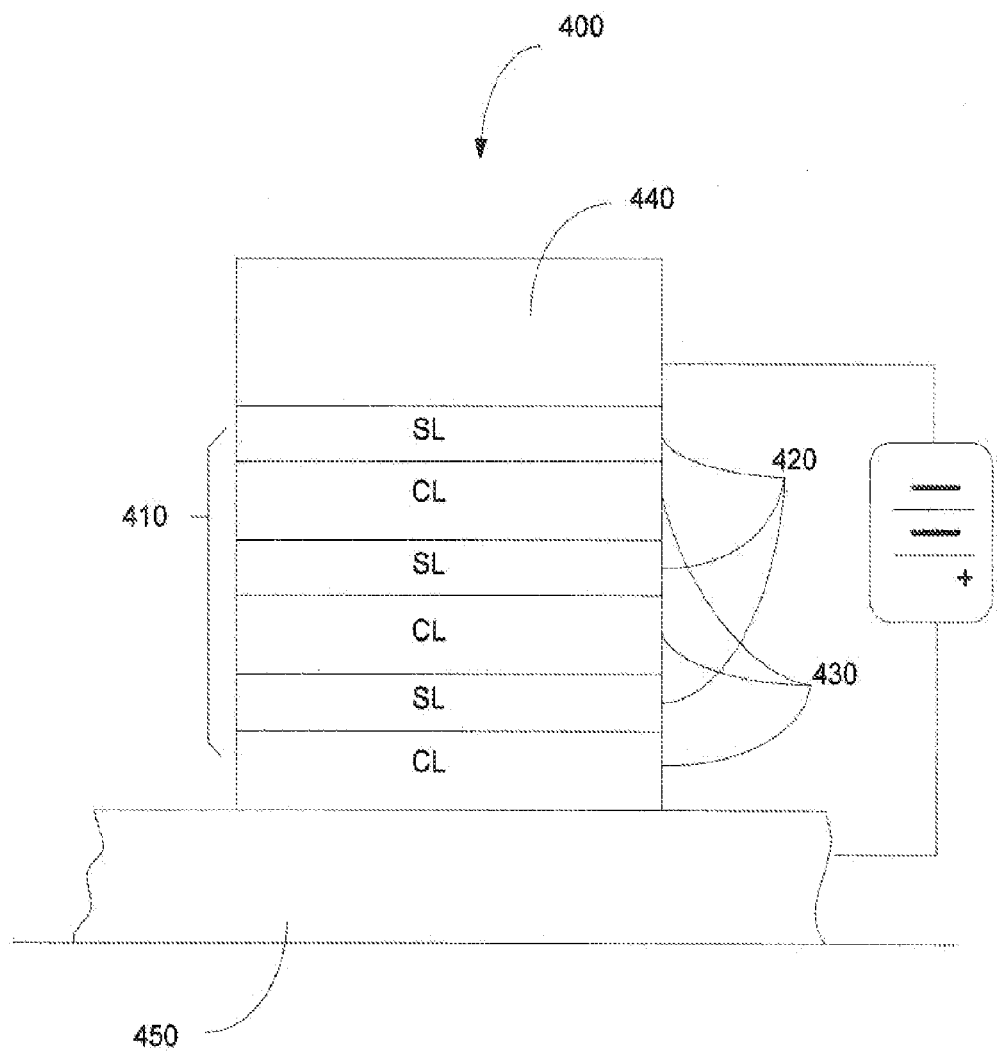
FIG. 4 is a schematic cross-sectional view of yet another embodiment of an electroforming-free nanoscale switching device.

FIG. 4 shows yet another embodiment of an electroforming-free nanoscale switching device 400. In this embodiment, the active region 410 between the electrodes 440 and 450 of the device has multiple switching layers ("SL") 420 and multiple conductive layers ("CL") 430. Each of the switching layers 420 is formed of a switching material, and each of the conductive layers 430 is formed of a dopant source material. The switching layers 420 are interleaved with conductive layers 430 such that a switching layer may be between two conductive layers, and vice versa. Each of the switching layers 430 in some embodiments may have a thickness of about 6 nm or less, and in other embodiments about 4 nm or less. An expected advantage of having multiple switching layers is that if one switching layer should fail there will be at least another switching layer that can still provide the switching function. For instance, if the dopant concentration in one switching layer has irreversibly increased to the point that the layer becomes permanently conductive, another switching layer or layers may still undergo controlled dopant drifting to switch the device between the ON and OFF states.

Figure 5:
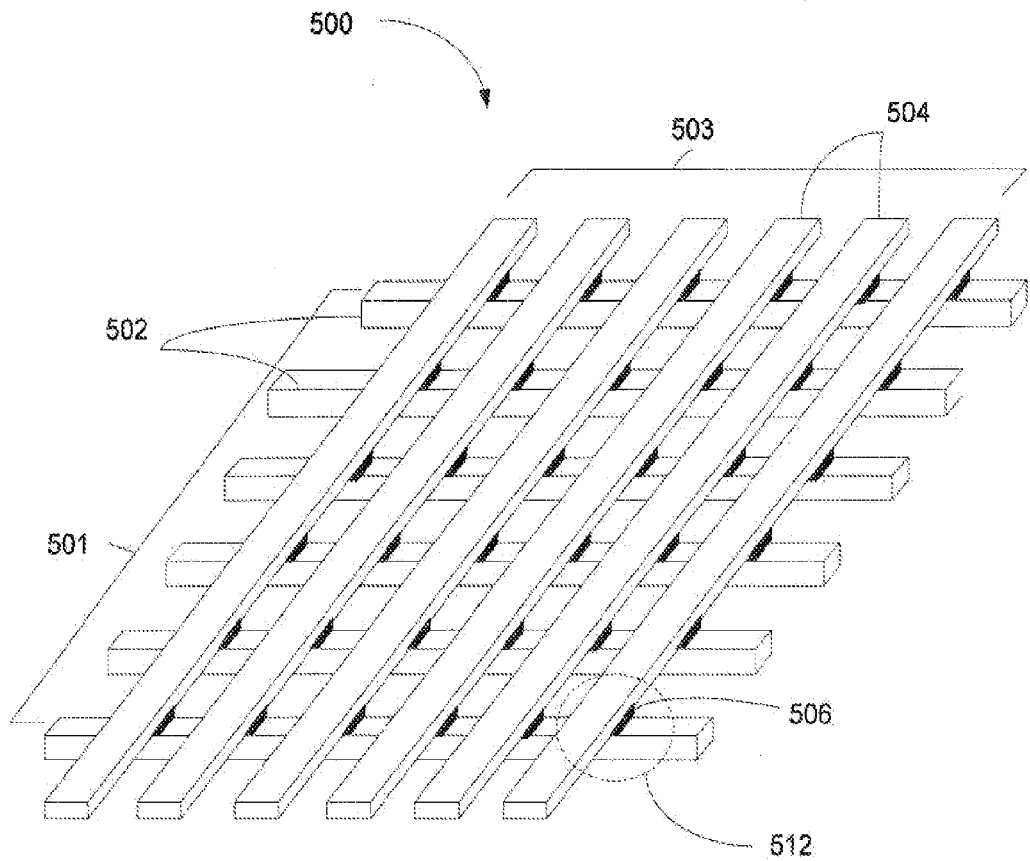
FIG. 5 is schematic cross-sectional views of a crossbar array of electroforming-free nanoscale switching devices in accordance with an embodiment of the invention.

The electroforming-free stable nanoscale switching device may be formed into an array for various applications. FIG. 5 shows an example of a two-dimensional array 500 of such switching devices. The array 500 has a first group 501 of generally parallel nanowires 502 running in a first direction, and a second group 503 of generally parallel nanowires 504 running in a second direction at an angle, such as 90 degrees, from the first direction. The two layers of nanowires 502 and 504 form a two-dimensional lattice which is commonly referred to as a crossbar structure, with each nanowire 502 in the first layer intersecting a plurality of the nanowires 504 of the second layer. A two-terminal switching device 506 may be formed at each intersection of the nanowires 502 and 504. The switching device 506 has a nanowire of the second group 503 as its top electrode and a nanowire of the first group 501 as the bottom electrode, and an active region 512 containing a switching material between the two nanowires. In accordance with an embodiment of the invention, the active region 512 has at least one thin switching layer that is capable of normal switching cycles without the need for electroforming, and may have a structure according to one of the embodiments described above with reference to FIGS. 2-4.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A nanoscale switching device, comprising:
    a first electrode of a nanoscale width;
    a second electrode of a nanoscale width;
    an active region disposed between and in electrical contact with the first and second electrodes, the active region having at least one switching layer formed of a switching material capable of carrying a species of dopants and transporting the dopants under an applied electric field, and at least one conductive layer in contact with the switching layer and formed of a dopant source material containing dopants that are capable of drifting into the switching layer under an applied electric field, the switching layer having a thickness of about 6 nm or less.

2. A nanoscale switching device as in claim 1, wherein the switching layer has a thickness of about 4 nm or less.

3. A nanoscale switching device as in claim 1, wherein the switching material is a metal oxide.

4. A nanoscale switching device as in claim 3, wherein the switching material is titanium oxide.

5. A nanoscale switching device as in claim 1, wherein the device has at least two conductive layers, and wherein the switching layer is disposed between the two conductive layers.

6. A nanoscale switching device as in claim 1, wherein device has a plurality of switching layers and a plurality of conductive layers, the switching layers being interleaved with the conductive layers.

7. A nanoscale crossbar array comprising:
    a first group of conductive nanowires running in a first direction;
    a second group of conductive nanowires running in a second direction and intersecting the first group of nanowires;
    a plurality of switching devices formed at intersections of the first and second groups of nanowires, each switching device having a first electrode formed by a first nanowire of the first group and a second electrode formed by a second nanowire of the second group, and an active region disposed at the intersection between the first and second nanowires, the active region having at least one switching layer formed of a switching material capable of carrying a species of dopants and transporting the dopants under an electric field and at least one conductive layer in contact with the switching layer and formed of a dopant source material containing dopants that are capable of drifting into the switching layer under an electric field, the switching layer having a thickness of about 6 nm or less.

8. A nanoscale crossbar array as in claim 7, wherein the switching layer has a thickness of about 4 nm or less.

9. A nanoscale crossbar array as in claim 7, wherein the switching material is a metal oxide.

10. A nanoscale crossbar array as in claim 9, wherein the switching material is titanium oxide.

11. A nanoscale crossbar array as in claim 7, wherein each switching device has at least two conductive layers, and wherein the switching layer is disposed between the two conductive layers.

12. A nanoscale crossbar array as in claim 7, wherein each switching device has a plurality of switching layers and a plurality of conductive layers, the switching layers being interleaved with the conductive layers.

* * * * *